(12) United States Patent  
Sato (10) Patent No.: US 8,022,524 B2  
(45) Date of Patent: Sep. 20, 2011

(54) SEMICONDUCTOR DEVICE (75) Inventor: Hitoshi Sato, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 233 days.

(21) Appl. No.: 12/331,670

(22) Filed: Dec. 10, 2008

(65) Prior Publication Data

US 2009/0152693 A1 Jun. 18, 2009

(30) Foreign Application Priority Data

Dec. 14, 2007 (JP) ................................ 2007-323744

(51) Int. Cl.  
*H01L 23/498* (2006.01)  
*H01L 23/52* (2006.01)

(52) U.S. Cl. ........ 257/686; 257/685; 257/690; 257/723; 257/724; 257/E23.019; 257/E23.021

(58) Field of Classification Search .................. 257/685, 257/686, 690, 723, 724, E23.019, E23.021  
See application file for complete search history.

(56) References Cited

U.S. PATENT DOCUMENTS

| | | | | |
|---|---|---|---|---|
| 6,323,439 | B1* | 11/2001 | Kambe et al. ................ | 174/262 |
| 2003/0165051 | A1* | 9/2003 | Kledzik et al. .............. | 361/760 |
| 2003/0234660 | A1* | 12/2003 | Jain .............................. | 324/765 |
| 2004/0196025 | A1* | 10/2004 | Casey et al. ................ | 324/158.1 |
| 2007/0096291 | A1* | 5/2007 | Kawabata et al. ........... | 257/700 |
| 2007/0096334 | A1* | 5/2007 | Kawabata et al. ........... | 257/777 |
| 2007/0170425 | A1* | 7/2007 | Tashiro et al. ............... | 257/48 |
| 2008/0258278 | A1* | 10/2008 | Ramos et al. ................ | 257/676 |

FOREIGN PATENT DOCUMENTS

JP 2006-351565 12/2006

* cited by examiner

*Primary Examiner* — Eugene Lee  
*Assistant Examiner* — Peniel M Gumedzoe  
(74) *Attorney, Agent, or Firm* — Rankin, Hill & Clark LLP (57) ABSTRACT

A semiconductor device includes a wiring board having: plural stacked insulating layers; test pads and external connection pads which are disposed on a face of the plural stacked insulating layers located on the side opposite to that where another wiring board is connected; first wiring patterns which electrically connect internal connection pads with the test pads; and second wiring patterns which electrically connect semiconductor element mounting pads with the external connection pads. The external connection pads are placed on the inner side of the test pads.

8 Claims, 4 Drawing Sheets

FIG. 4

SEMICONDUCTOR DEVICE

TECHNICAL FIELD

The present disclosure relates to a semiconductor device. More particularly, the present disclosure relates to a semiconductor device including a wiring board having: plural stacked insulating layers; a test pad and an external connection pad disposed on a face of the stacked insulating layers opposite to those with which another wiring board is connected; a first wiring pattern which electrically connects an internal connection pad with the test pad; and a second wiring pattern which electrically connects a semiconductor element mounting pad with the external connection pad.

RELATED ART

A wiring board (corresponding to a first wiring board 201 shown in FIG. 1) has: plural stacked insulating layers; test pads and external connection pads disposed on a face of the stacked insulating layers opposite to those with which another wiring board is to be connected; first wiring patterns which electrically connect internal connection pads with the test pads; and second wiring patterns which electrically connect semiconductor element mounting pads with the external connection pads.

A semiconductor device (see FIG. 1) includes the wiring board having the above-described configuration, and the other wiring board that is placed thereabove, and is configured so as to electrically connect the wiring board with the other wiring board.

Figure 1:
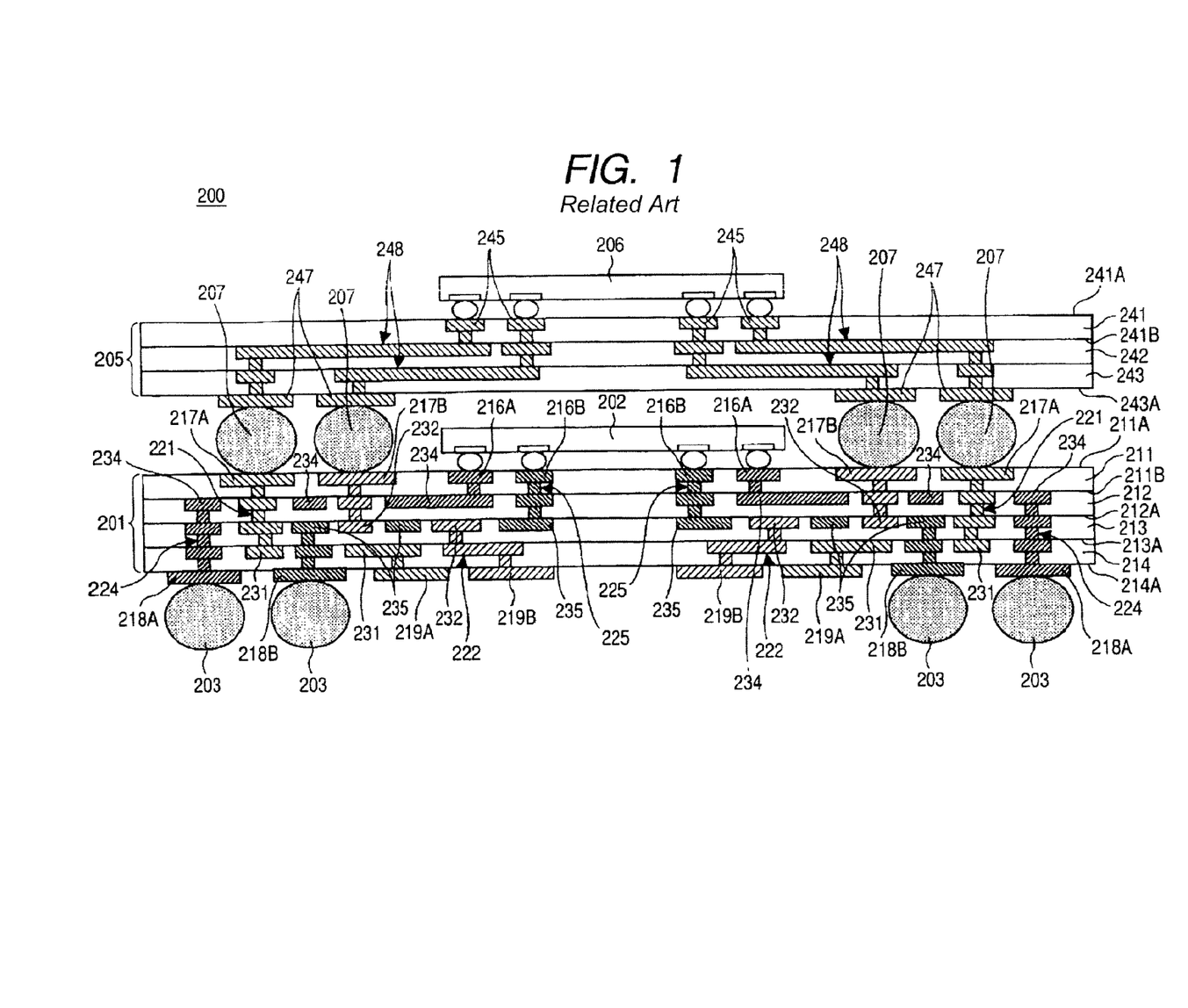
FIG. 1 is a sectional view of a related-art semiconductor device.

FIG. 1 is a sectional view of the related-art semiconductor device.

Referring to FIG. 1, the related-art semiconductor device 200 has the first wiring board 201, a semiconductor element 202, external connection terminals 203, a second wiring board 205, an electronic component 206, and internal connection terminals 207.

The first wiring board 201 is a coreless wiring board, and has plural stacked insulating layers 211 to 214, semiconductor element mounting pads 216A, 216B, internal connection pads 217A, 217B, external connection pads 218A, 218B, test pads 219A, 219B, first wiring patterns 221, 222, and second wiring patterns 224, 225.

The plural stacked insulating layers 211 to 214 have a configuration where the insulating layer 212, the insulating layer 213, and the insulating layer 214 are sequentially stacked on the lower face 211B of the insulating layer 211.

The semiconductor element mounting pads 216A, 216B are disposed in the insulating layer 211 so that the faces of the semiconductor element mounting pads 216A, 216B on the side where the semiconductor element 202 is mounted are substantially flush with the upper face 211A of the insulating layer 211. The semiconductor element mounting pads 216A, 216B are placed in the insulating layer 211 in a portion corresponding to a middle portion of the first wiring board 201.

The internal connection pads 217A, 217B are disposed in the insulating layer 211 so that the faces of the internal connection pads 217A, 217B on the side where the internal connection terminals 207 are mounted are substantially flush with the upper face 211A of the insulating layer 211. The internal connection pads 217A, 217B are placed in the insulating layer 211 in a portion corresponding to an outer peripheral portion of the first wiring board 201.

The external connection pads 218A, 218B are disposed on the lower face 214A of the insulating layer 214. The external connection pads 218A, 218B are placed in the insulating layer 214 in a portion corresponding to the outer peripheral portion of the first wiring board 201.

The test pads 219A, 219B are disposed on the lower face 214A of the insulating layer 214. The test pads 219A, 219B are placed in the insulating layer 214 in a portion corresponding to the middle portion of the first wiring board 201. The test pads 219A, 219B are used for performing electrical inspection of the semiconductor device 200 before the semiconductor device 200 is mounted on a mounting board (not shown) such as a mother board.

The first wiring patterns 221 are disposed in the plural stacked insulating layers 211 to 214, and configured by plural wirings and vias. One end portions of the first wiring patterns 221 are connected with the internal connection pads 217A, and the other end portions are connected with the test pads 219A. The first wiring patterns 221 have routing wirings 231 which are disposed in the lower face 213A of the insulating layer 213. The routing wirings 231 are wirings for routing the first wiring patterns 221 from the internal connection pads 217A placed in the outer peripheral portion of the first wiring board 201, to the test pads 219A placed in the middle portion of the first wiring board 201.

The first wiring patterns 222 are disposed in the plural stacked insulating layers 211 to 214, and configured by plural wirings and vias. One end portions of the first wiring patterns 222 are connected with the internal connection pads 217B, and the other end portions are connected with the test pads 219B. The first wiring patterns 222 have routing wirings 232 which are disposed in the lower face 212A of the insulating layer 212. The routing wirings 232 are wirings for routing the first wiring patterns 222 from the internal connection pads 217B placed in the outer peripheral portion of the first wiring board 201, to the test pads 219B placed in the middle portion of the first wiring board 201.

The second wiring patterns 224 are disposed in the plural stacked insulating layers 211 to 214, and configured by plural wirings and vias. One end portions of the second wiring patterns 224 are connected with the semiconductor element mounting pads 216A, and the other end portions are connected with the external connection pads 218A. The second wiring patterns 224 have routing wirings 234 which are disposed in the lower face 211B of the insulating layer 211. The routing wirings 234 are wirings for routing the first wiring patterns 224 from the semiconductor element mounting pads 216A placed in the middle portion of the first wiring board 201, to the external connection pads 218A placed in the outer peripheral portion of the first wiring board 201.

The second wiring patterns 225 are disposed in the plural stacked insulating layers 211 to 214, and configured by plural wirings and vias. One end portions of the second wiring patterns 225 are connected with the semiconductor element mounting pads 216B, and the other end portions are connected with the external connection pads 218B. The second wiring patterns 225 have routing wirings 235 which are disposed in the lower face 212A of the insulating layer 212. The routing wirings 235 are wirings for routing the second wiring patterns 225 from the semiconductor element mounting pads 216B placed in the middle portion of the first wiring board 201, to the external connection pads 218B placed in the outer peripheral portion of the first wiring board 201.

The semiconductor element 202 is mounted on the semiconductor element mounting pads 216A, 216B disposed in the first wiring board 201. The external connection terminals 203 are disposed on the external connection pads 218A, 218B. The external connection terminals 203 are to be connected with the mounting board (not shown) such as a mother board.

The second wiring board 205 has plural stacked insulating layers 241 to 243, electronic component mounting pads 245, internal connection pads 247, and wiring patterns 248.

The plural stacked insulating layers 241 to 243 have the configuration where the insulating layer 242 and the insulating layer 243 are sequentially stacked on the lower face 241B of the insulating layer 241.

The electronic component mounting pads 245 are disposed in the insulating layer 241 so that the faces of the electronic component mounting pads 245 on the side where the electronic component 206 is mounted are substantially flush with the upper face 241A of the insulating layer 241.

The internal connection pads 247 are disposed on the lower face 243A of the insulating layer 243. The internal connection pads 247 are connected with the internal connection terminals 207, and electrically connected with the first wiring board 201 through the internal connection terminals 207.

The electronic component 206 is mounted on the electronic component mounting pads 245 disposed in the second wiring board 205. The internal connection terminals 207 are placed between the first wiring board 201 and the second wiring board 205. The upper ends of the internal connection terminals 207 are connected with the internal connection pads 217A, 217B disposed in the first wiring board 201, and the lower ends are connected with the internal connection pads 247 disposed on the second wiring board 205 (for example, see Patent Reference 1).

[Patent Reference 1] Japanese Patent Unexamined Publication no. 2006-351565

In the related-art semiconductor device 200, the external connection pads 218A, 218B on which the external connection terminals 203 are disposed are placed on the lower face 214A of the insulating layer 214 in the portion corresponding to the outer peripheral portion of the first wiring board 201. In the case where, for example, solders on pads of the mounting board (not shown) such as a mother board are heated and melted and the first wiring board 201 is mounted on the mounting board, therefore, warpage of the first wiring board 201 occurs because of the difference in coefficient of thermal expansion between the semiconductor element 202, the first wiring board 201, the mounting board, and the like, and the outer peripheral portion of the first wiring board 201 warps upward (in other words, in a direction away from the mounting board). In this case, there is a problem in that a connection failure occurs between the external connection terminals 203 disposed on the external connection pads 218A, 218B of the first wiring board 201, and pads of the mounting board, and the reliability of the electrical connection between the first wiring board 201 and the mounting board is reduced.

In the related-art semiconductor device 200, moreover, the internal connection pads 217A, 217B placed in the outer peripheral portion of the first wiring board 201 are electrically connected with the test pads 219A, 219B placed in the middle portion of the first wiring board 201, by using the first wiring patterns 221, 222 including the routing wirings 231, 232, and the semiconductor element mounting pads 216A, 216B placed in the middle portion of the first wiring board 201 are electrically connected with the external connection pads 218A, 218B placed in the outer peripheral portion of the first wiring board 201, by using the second wiring patterns 224, 225 including the routing wirings 234, 235. Therefore, there is a problem in that, as the wiring lengths of the first and second wiring patterns are longer, the routing of the first and second wiring patterns becomes more complicated, and crosstalk (noises) occurs.

The above-discussed two problems are caused also in the case where the first and/or second wiring boards 201, 205 are core-equipped build-up boards having a core board.

SUMMARY

Exemplary embodiments of the present invention provide a semiconductor device in which, when the apparatus is connected with a mounting board, the reliability of an electrical connection can be improved, and crosstalk can be reduced.

According to one aspect of the invention, a semiconductor device comprises:
 a first wiring board having
  plural stacked insulating layers,
  an internal connection pad which is disposed on a side of an upper face of the plural stacked insulating layers,
  a semiconductor element mounting pad which is disposed on the side of the upper face of the plural stacked insulating layers,
  a test pad which is disposed on a side of a lower face of the plural stacked insulating layers,
  an external connection pad which is disposed on the side of the lower face of the plural stacked insulating layers, and on which an external connecting terminal is disposed,
  a first wiring pattern which is disposed in the plural stacked insulating layers, and which electrically connects the internal connection pad with the test pad, and
  a second wiring patterns which electrically connects the semiconductor element mounting pad with the external connection pad;
 a second wiring board which is placed above the first wiring board, which is mounted on the internal connection pad, and which is electrically connected with the first wiring board; and
 a semiconductor element which is mounted on the semiconductor element mounting pad,
 wherein the external connection pad is placed on an inner side of the test pad.

The first wiring board may has an electronic component mounting pad which is disposed on the side of the upper face of the plural stacked insulating layers, and the semiconductor device may comprise an electronic component which is mounted on the electronic component mounting pad.

According to the invention, the configuration where the external connection pads are placed on the inner side of the test pads allows warpage of the semiconductor device (for example, warpage of the semiconductor device which occurs in the case where solders on pads of a mounting board such as a mother board are heated and melted and the semiconductor device is mounted on the mounting board) in a portion located inside the outer peripheral portion of the first wiring board, to be smaller in degree than that of the semiconductor device in a portion corresponding to the outer peripheral portion of the first wiring board. Therefore, the reliability of the connection between the external connecting terminals disposed on the external connection pads and the pads of the mounting board can be improved, and the reliability of the electrical connection between the semiconductor device and the mounting board can be improved.

Moreover, the configuration where the external connection pads are placed on the inner side of the test pads allows the wiring lengths of the first wiring patterns which electrically connect the internal connection pads with the test pads, and those of the second wiring patterns which electrically connect the semiconductor element mounting pads with the external connection pads, to be shortened, and also the routing of the first and second wiring patterns not to become complicated. Therefore, crosstalk (noises) due to the first and second wiring patterns can be reduced.

According to the invention, the reliability of the electrical connection of the semiconductor device connected with a mounting board can be improved, and crosstalk can be reduced.

Other features and advantages may be apparent from the following detailed description, the accompanying drawings and the claims.

DETAILED DESCRIPTION

Hereinafter, an embodiment of the invention will be described with reference to the accompanying drawings.

Embodiment

Figure 2:
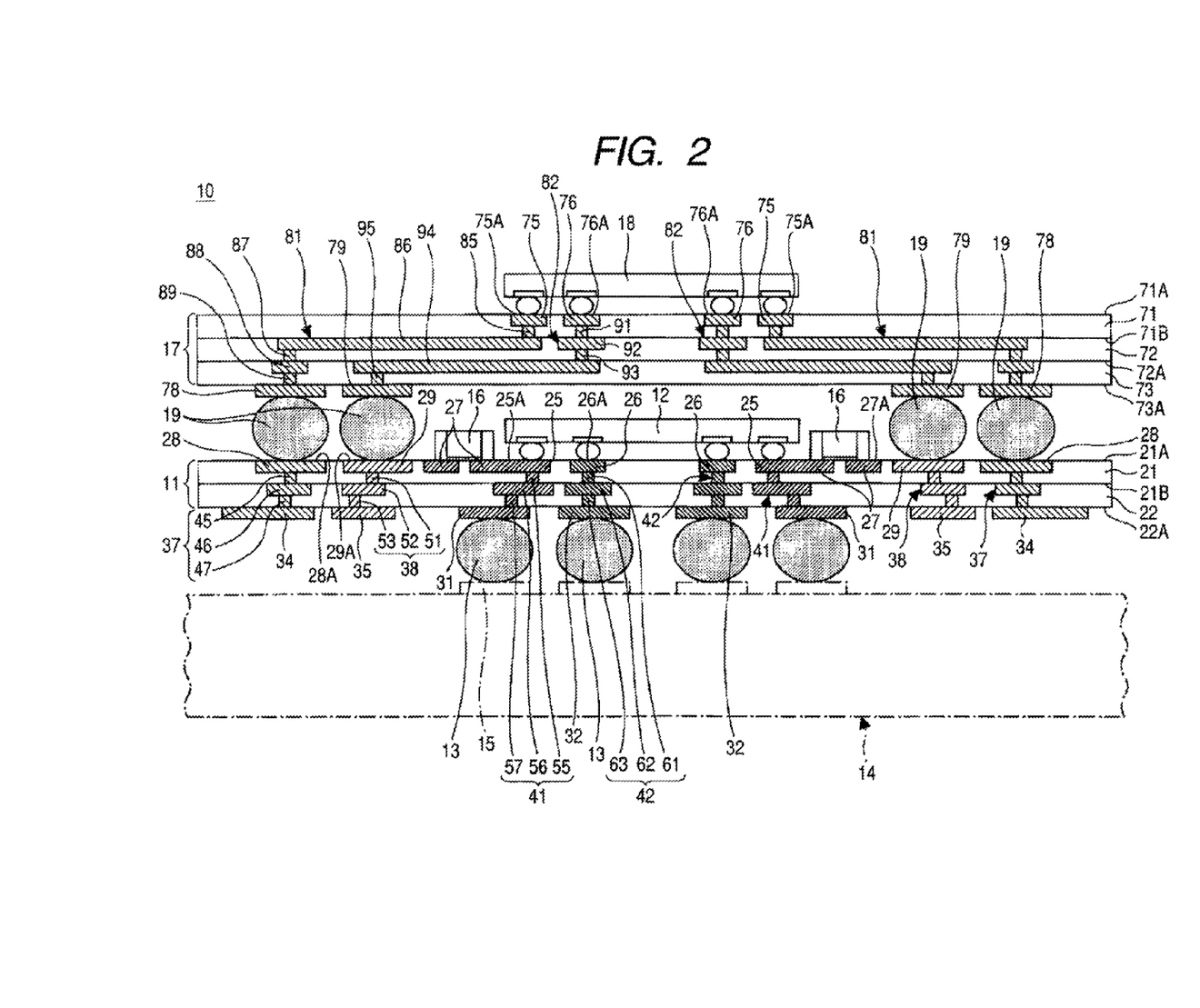
FIG. 2 is a sectional view of a semiconductor device of an embodiment of the invention.

FIG. 2 is a sectional view of a semiconductor device of the embodiment of the invention.

Referring to FIG. 2, the semiconductor device 10 of the embodiment has a first wiring board 11, a semiconductor element 12, external connection terminals 13, electronic components 16, a second wiring board 17, an electronic component 18, and internal connection terminals 19.

The first wiring board 11 is a coreless wiring board, and has plural stacked insulating layers 21, 22, semiconductor element mounting pads 25, 26, electronic component mounting pads 27, internal connection pads 28, 29, external connection pads 31, 32, test pads 34, 35, first wiring patterns 37, 38, and second wiring patterns 41, 42.

The plural stacked insulating layers 21, 22 have a configuration where the insulating layer 22 is stacked on the lower face 21B of the insulating layer 21. As the insulating layers 21, 22, for example, an insulating resin layer may be used. As the material of the insulating resin layers, for example, an epoxy resin, a polyimide resin, or the like may be used.

The semiconductor element mounting pads 25, 26 are disposed in the insulating layer 21 so that the mounting faces 25A, 26A of the semiconductor element mounting pads 25, 26 on the side where the semiconductor element 12 is mounted are substantially flush with the upper face 21A (the upper face of the plural stacked insulating layers 21, 22) of the insulating layer 21. The semiconductor element mounting pads 25, 26 are placed in the insulating layer 21 in a portion corresponding to a middle portion of the first wiring board 11. As the semiconductor element mounting pads 25, 26, for example, a metal film (e.g., a Cu film) may be used. In the case where a Cu film is used as the semiconductor element mounting pads 25, 26, a diffusion preventing layer (for example, a Ni/Au stacked film in which a Ni layer and an Au layer are sequentially stacked) may be formed on the Cu films.

The electronic component mounting pads 27 are disposed in the insulating layer 21 so that the mounting faces 27A of the electronic component mounting pads 27 on the side where the semiconductor element 12 is mounted are substantially flush with the upper face 21A (the upper face of the plural stacked insulating layers 21, 22) of the insulating layer 21. The electronic component mounting pads 27 are placed in the vicinities of the semiconductor element mounting pads 25, and electrically connected therewith. The electronic component mounting pads 27 are used for mounting the electronic components 16. As the electronic component mounting pads 27, for example, a metal film (e.g., a Cu film) may be used. In the case where a Cu film is used as the electronic component mounting pads 27, a diffusion preventing layer (for example, a Ni/Au stacked film in which a Ni layer and an Au layer are sequentially stacked) may be formed on the Cu films.

The internal connection pads 28, 29 are disposed in the insulating layer 21 so that the faces 28A, 29A of the internal connection pads 28, 29 on the side where the internal connection terminals 19 are substantially flush with the upper face 21A (the upper face of the plural stacked insulating layers 21, 22) of the insulating layer 21. The internal connection pads 28, 29 are placed in the insulating layer 21 in a portion corresponding to an outer peripheral portion of the first wiring board 11. As the internal connection pads 28, 29, for example, a metal film (e.g., a Cu film) may be used. A diffusion preventing layer (for example, a Ni/Au stacked film in which a Ni layer and an Au layer are sequentially stacked) may be formed on the faces of the internal connection pads 28, 29 opposed to the internal connection terminals 19.

The external connection pads 31, 32 are terminals on which the external connection terminals 13 are disposed, and disposed on the lower face 22A (the lower face of the plural stacked insulating layers 21, 22) of the insulating layer 22. The external connection pads 31, 32 are placed on the inner side of the test pads 34, 35. As the external connection pads 31, 32, for example, a metal film (e.g., a Cu film) may be used. A diffusion preventing layer (for example, a Ni/Au stacked film in which a Ni layer and an Au layer are sequentially stacked) may be formed on the faces of the external connection pads 31, 32 opposed to the external connection terminals 13.

The configuration where the external connection pads 31, 32 are placed on the inner side of the test pads 34, 35 allows warpage of the first wiring board 11 (for example, warpage of the first wiring board 11 which occurs in the case where solders on pads 15 of a mounting board 14 such as a mother board are heated and melted and the first wiring board 11 is mounted on the mounting board 14) in a portion located inside the outer peripheral portion of the first wiring board 11, to be smaller in degree than that of the outer peripheral portion of the first wiring board 11. Therefore, the reliability of the connection between the external connection terminals 13 disposed on the external connection pads 31, 32 and the pads 15 of the mounting board 14 can be improved, and the reliability of the electrical connection between the first wiring board 11 and the mounting board 14 can be improved.

Moreover, the configuration where the external connection pads 31, 32 are placed on the inner side of the test pads 34, 35 allows the wiring lengths of the first wiring patterns 37, 38 which electrically connect the internal connection pads 28, 29 with the test pads 34, 35, and those of the second wiring patterns 41, 42 which electrically connect the semiconductor element mounting pads 25, 26 with the external connection pads 31, 32, to be shortened, and also the routing of the first and second wiring patterns 37, 38, 41, 42 not to become complicated. Therefore, crosstalk (noises) due to the first and second wiring patterns 37, 38, 41, 42 can be reduced.

The external connection pads 31, 32 are placed on the lower face 22A of the insulating layer 22 in the portion corresponding to the middle portion of the first wiring board 11. The configuration where the external connection pads 31, 32 are placed on the lower face 22A of the insulating layer 22 in the portion corresponding to the middle portion of the first wiring board 11 in which warpage that is minimum in the first wiring board 11 occurs can further improve the reliability of the electrical connection between the first wiring board 11 and the mounting board 14.

The external connection pads 31 are placed so as to be opposed to the semiconductor element mounting pads 25 through the plural stacked insulating layers 21, 22, and the external connection pads 32 are placed so as to be opposed to the semiconductor element mounting pads 26 through the plural stacked insulating layers 21, 22.

The configuration where the external connection pads 31, 32 are placed so as to be opposed to the semiconductor element mounting pads 25, 26 enables the wiring lengths of the second wiring patterns 41 which electrically connect the external connection pads 31 with the semiconductor element mounting pads 25, and those of the second wiring patterns 42 which electrically connect the external connection pads 32 with the semiconductor element mounting pads 26, to be shortened as far as possible (in other words, the routing wirings 234, 235 which are disposed in the first wiring board 201 in the related-art wiring board (see FIG. 1) are not necessary). Therefore, crosstalk (noises) due to the second wiring patterns 41, 42 can be further reduced.

The test pads 34, 35 are used for performing electrical inspection of the semiconductor device 10. The test pads 34, 35 are disposed on the lower face 22A (the lower face of the plural stacked insulating layers 21, 22) of the insulating layer 22 corresponding to the outer peripheral portion of the first wiring board 11. The test pads 34, 35 are placed on the lower face 22A of the insulating layer 22 which is located on the outer side of the external connection pads 31, 32.

The test pads 34 are placed so as to be opposed to the internal connection pads 28 through the plural stacked insulating layers 21, 22, and the test pads 35 are placed so as to be opposed to the internal connection pads 29 through the plural stacked insulating layers 21, 22.

The configuration where the test pads 34, 35 are placed so as to be opposed to the internal connection pads 28, 29 enables the wiring lengths of the first wiring patterns 37 which electrically connect the test pads 34 with the internal connection pads 28, and those of the first wiring patterns 38 which electrically connect the test pads 35 with the internal connection pads 29, to be shortened as far as possible (in other words, the routing wirings 231, 232 which are disposed in the first wiring board 201 in the related-art wiring board (see FIG. 1) are not necessary). Therefore, crosstalk (noises) due to the first wiring patterns 37, 38 can be further reduced.

The test pads 34, 35 may be disposed on the lower face 22A of the insulating layer 22 so that their formation areas have a frame-like shape in a plan view. The test pads 34, 35 may be disposed only in corner edge portions of the first wiring board 11 where the amount of warpage in the first wiring board 11 is maximum in the whole first wiring board 11.

The configuration where the test pads 34, 35 are disposed only on the lower face 22A of the insulating layer 22 in portions corresponding to the corner edge portions of the first wiring board 11 where the amount of warpage of the first wiring board 11 is large allows the external connection pads 31, 32 to be disposed on the lower face 22A of the insulating layer 22 in portions corresponding to those where the amount of warpage of the first wiring board 11 is small.

As the test pads 34, 35, for example, a metal film (e.g., a Cu film) may be used. In the test pads 34, 35, a diffusion preventing layer (for example, a Ni/Au stacked film in which a Ni layer and an Au layer are sequentially stacked) may be disposed.

The first wiring patterns 37 are disposed in the plural stacked insulating layers 21, 22, and configured so as to have vias 45, 47 and wirings 46. The vias 45 are disposed so as to pass through the insulating layer 21 in the portions located below the internal connection pads 28. The upper ends of the vias 45 are connected with the internal connection pads 28. The wirings 46 are disposed in the lower face 21B of the insulating layer 21, and connected with the lower ends of the vias 45. The vias 47 are disposed so as to pass through the insulating layer 22 in portions located between the wirings 46 and the test pads 34. The upper ends of the vias 47 are connected with the wirings 46, and the lower ends with the test pads 34.

The thus configured first wiring patterns 37 are formed by conductors for electrically connecting the internal connection pads 28 and test pads 34 that are opposed to each other through the insulating layers 21, 22. As the first wiring patterns 37, for example, a metal film (e.g., a Cu film) may be used.

The configuration where the first wiring patterns 37 for electrically connecting the internal connection pads 28 with the test pads 34 are disposed between the internal connection pads 28 and test pads 34 that are opposed to each other through the insulating layers 21, 22 enables the first wiring patterns 37 to be shorter in wiring length than the first wiring patterns 221, 222 which are disposed in the related-art first wiring board 201 (see FIG. 1), and which electrically connect the internal connection pads 217A, 217B with the test pads 219A, 219B.

The first wiring patterns 38 are disposed in the plural stacked insulating layers 21, 22, and configured so as to have vias 51, 53 and wirings 52. The vias 51 are disposed so as to pass through the insulating layer 21 in the portions located below the internal connection pads 29. The upper ends of the vias 51 are connected with the internal connection pads 29. The wirings 52 are disposed in the lower face 21B of the insulating layer 21, and connected with the lower ends of the vias 51. The vias 53 are disposed so as to pass through the insulating layer 22 in portions located between the wirings 52 and the test pads 35. The upper ends of the vias 53 are connected with the wirings 52, and the lower ends with the test pads 35.

The thus configured first wiring patterns 38 are formed by conductors for electrically connecting the internal connection pads 29 and test pads 35 that are opposed to each other through the insulating layers 21, 22. As the first wiring patterns 38, for example, a metal film (e.g., a Cu film) may be used.

The configuration where the first wiring patterns 38 for electrically connecting the internal connection pads 29 with the test pads 35 are disposed between the internal connection pads 29 and test pads 35 that are opposed to each other through the insulating layers 21, 22 enables the first wiring patterns 38 to be shorter in wiring length than the first wiring patterns 221, 222 which are disposed in the related-art first wiring board 201 (see FIG. 1), and which electrically connect the internal connection pads 217A, 217B with the test pads 219A, 219B. Therefore, the layer number of the plural stacked insulating layers 21, 22 can be reduced than that of the related-art configuration, and hence the size in the thickness direction of the first wiring board 11 can be reduced.

The second wiring patterns 41 are disposed in the plural stacked insulating layers 21, 22, and configured so as to have vias 55, 57 and wirings 56. The vias 55 are disposed so as to pass through the insulating layer 21 in the portions located below the semiconductor element mounting pads 25. The upper ends of the vias 55 are connected with the semiconductor element mounting pads 25. The wirings 56 are disposed in the lower face 21B of the insulating layer 21, and connected with the lower ends of the vias 55. The vias 57 are disposed so as to pass through the insulating layer 22 in portions located between the wirings 56 and the external connection pads 31. The upper ends of the vias 57 are connected with the wirings 56, and the lower ends with the external connection pads 31.

The thus configured second wiring patterns 41 are formed by conductors for electrically connecting the semiconductor element mounting pads 25 and external connection pads 31 that are opposed to each other through the insulating layers 21, 22. As the second wiring patterns 41, for example, a metal film (e.g., a Cu film) may be used.

The configuration where the second wiring patterns 41 for electrically connecting the semiconductor element mounting pads 25 with the external connection pads 31 are disposed between the semiconductor element mounting pads 25 and external connection pads 31 that are opposed to each other through the insulating layers 21, 22 enables the second wiring patterns 41 to be shorter in wiring length than the second wiring patterns 224, 225 which are disposed in the related-art first wiring board 201 (see FIG. 1), and which electrically connects the semiconductor element mounting pads 216A, 216B with the external connection pads 218A, 218B. Therefore, the layer number of the plural stacked insulating layers 21, 22 can be reduced than that of the related-art configuration, and hence the size in the thickness direction of the first wiring board 11 can be reduced.

The second wiring patterns 42 are disposed in the plural stacked insulating layers 21, 22, and configured so as to have vias 61, 63 and wirings 62. The vias 61 are disposed so as to pass through the insulating layer 21 in the portions located below the semiconductor element mounting pads 26. The upper ends of the vias 55 are connected with the semiconductor element mounting pads 26. The wirings 62 are disposed in the lower face 21B of the insulating layer 21, and connected with the lower ends of the vias 61. The vias 63 are disposed so as to pass through the insulating layer 22 in portions located between the wirings 62 and the external connection pads 32. The upper ends of the vias 63 are connected with the wirings 62, and the lower ends with the external connection pads 32.

The thus configured second wiring patterns 42 are formed by conductors for electrically connecting the semiconductor element mounting pads 26 and external connection pads 32 that are opposed to each other through the insulating layers 21, 22. As the second wiring patterns 42, for example, a metal film (e.g., a Cu film) may be used.

The configuration where the second wiring patterns 42 for electrically connecting the semiconductor element mounting pads 26 with the external connection pads 32 are disposed between the semiconductor element mounting pads 26 and external connection pads 32 that are opposed to each other through the insulating layers 21, 22 enables the second wiring patterns 42 to be shorter in wiring length than the second wiring patterns 224, 225 which are disposed in the related-art first wiring board 201 (see FIG. 1), and which electrically connects the semiconductor element mounting pads 216A, 216B with the external connection pads 218A, 218B.

The semiconductor element 12 is mounted (flip chip mounted) on the semiconductor element mounting pads 25, 26. As the semiconductor element 12, for example, a logic semiconductor element may be used.

The external connection terminals 13 are disposed on the external connection pads 31, 32. The external connection terminals 13 are terminals which, when the semiconductor device 10 is mounted on the mounting board 14 such as a mother board, are to be electrically connected with the pads 15 disposed on the mounting board 14. As the external connection terminals 13, for example, solder balls may be used.

The electronic components 16 are mounted on the electronic component mounting pads 27, and electrically connected with the semiconductor element 12. As the electronic components 16, for example, chip capacitors, chip inductors, chip resistors, and the like may be used.

The second wiring board 17 has plural stacked insulating layers 71 to 73, electronic component mounting pads 75, 76, internal connection pads 78, 79, and wiring patterns 81, 82.

The plural stacked insulating layers 71 to 73 have a configuration where the insulating layer 72 and the insulating layer 73 are sequentially stacked on the lower face 71B of the insulating layer 71. As the insulating layers 71 to 73, for example, an insulating resin layer may be used. As the material of the insulating resin layers, for example, an epoxy resin, a polyimide resin, or the like may be used.

The electronic component mounting pads 75, 76 are disposed in the insulating layer 71 so that the faces 75A, 76A of the electronic component mounting pads 75, 76 on the side where the electronic component 18 is mounted are substantially flush with the upper face 71A of the insulating layer 71. As the electronic component mounting pads 75, 76, for example, a metal film (e.g., a Cu film) may be used. A diffusion preventing layer (for example, a Ni/Au stacked film in which a Ni layer and an Au layer are sequentially stacked) may be formed on the faces of the electronic component mounting pads 75, 76 opposed to the electronic component 18.

The internal connection pads 78, 79 are disposed on the lower face 73A of the insulating layer 73, and connected with the internal connection terminals 19. The internal connection pads 78 are electrically connected with the internal connection pads 28 disposed in the first wiring board 11 through the internal connection terminals 19, and also with the electronic component mounting pads 75 through the wiring patterns 81. The internal connection pads 79 are electrically connected with the internal connection pads 29 disposed in the first wiring board 11 through the internal connection terminals 19, and also with the electronic component mounting pads 76 through the wiring patterns 82. As the internal connection pads 78, 79, for example, a metal film (e.g., a Cu film) may be used. A diffusion preventing layer (for example, a Ni/Au stacked film in which a Ni layer and an Au layer are sequentially stacked) may be formed on the faces of the internal connection pads 78, 79 opposed to the internal connection terminals 19.

The wiring patterns 81 are disposed in the plural stacked insulating layers 71 to 73, and configured so as to have vias 85, 87, 89 and wirings 86, 88. The vias 85 are disposed so as to pass through the insulating layer 71 in the portions located below the electronic component mounting pads 75. The upper ends of the vias 85 are connected with the electronic component mounting pads 75. The wirings 86 are disposed in the lower face 71B of the insulating layer 71, and connected with the lower ends of the vias 85. The vias 87 are disposed so as to pass through the insulating layer 72 in the portions located below the wirings 86. The wirings 88 are disposed in the lower face 72A of the insulating layer 72, and connected with the lower ends of the vias 87. The vias 89 are disposed so as to pass through the insulating layer 73 in the portions located between the internal connection pads 78 and the wirings 88. The upper ends of the vias 89 are connected with the wirings 88, and the lower ends with the internal connection pads 78. The thus configured wiring patterns 81 electrically connect the electronic component mounting pads 75 with the internal connection pads 78.

The wiring patterns 82 are disposed in the plural stacked insulating layers 71 to 73, and configured so as to have vias 91, 93, 95 and wirings 92, 94. The vias 91 are disposed so as to pass through the insulating layer 71 in the portions located below the electronic component mounting pads 76. The upper ends of the vias 91 are connected with the electronic component mounting pads 76. The wirings 92 are disposed in the lower face 71B of the insulating layer 71, and connected with the lower ends of the vias 91. The vias 93 are disposed so as to pass through the insulating layer 72 in the portions located below the wirings 92. The wirings 94 are disposed in the lower face 72A of the insulating layer 72, and connected with the lower ends of the vias 93. The vias 95 are disposed so as to pass through the insulating layer 73 in the portions located between the internal connection pads 79 and the wirings 94. The upper ends of the vias 95 are connected with the wirings 94, and the lower ends with the internal connection pads 79. The thus configured wiring patterns 82 electrically connect the electronic component mounting pads 76 with the internal connection pads 79.

The electronic component 18 is mounted on the electronic component mounting pads 75, 76 disposed in the second wiring board 17. As the electronic component 18, for example, a semiconductor element, a chip capacitor, a chip resistor, a chip inductor, or the like may be used.

The internal connection terminals 19 are disposed between the internal connection pads 28 disposed in the first wiring board 11, and the internal connection pads 78 disposed on the second wiring board 17, and between the internal connection pads 29 disposed in the first wiring board 11, and the internal connection pads 79 disposed on the second wiring board 17. The internal connection terminals 19 are used for electrically connecting the internal connection pads 28 with the internal connection pads 78, and the internal connection pads 29 with the internal connection pads 79. The diameter of the internal connection terminals 19 is set to have a dimension which allows the semiconductor element 12 to be accommodated in a gap formed between the first wiring board 11 and the second wiring board 17. As the internal connection terminals, for example, solder balls, electrically conductive balls each configured by a core portion which is used for maintaining the gap between the first wiring board 11 and the second wiring board 17 at a predetermined value, and a covering portion which covers the core portion, or the like may be used.

The configuration where electrically conductive balls each having the core portion which is used for maintaining the gap between the first wiring board 11 and the second wiring board 17 at a predetermined value are used as the internal connection terminals 19 allows the gap between the first wiring board 11 and the second wiring board 17 to be maintained at the predetermined value even when an external force is applied to the semiconductor element 12. Furthermore, the second wiring board 17 can be accurately mounted on the first wiring board 11 so as to be substantially parallel to the first wiring board 11.

As the core portion, for example, a metal ball (e.g., a Cu ball) or a resin ball may be used. As the material of the resin ball, for example, polystyrene, polyacrylic ester, polyvinyl chloride, or the like may be used. As the material of the covering portion, for example, solder may be used.

According to the semiconductor device of the embodiment, the configuration where the external connection pads 31, 32 are placed on the inner side of the test pads 34, 35 allows warpage of the semiconductor device 10 (for example, warpage of the semiconductor device 10 which occurs in the case where solders on the pads 15 of the mounting board 14 such as a mother board are heated and melted and the semiconductor device 10 is mounted on the mounting board 14) in a portion placed inside the outer peripheral portion of the first wiring board 11, to be smaller in degree than that of the semiconductor device in a portion corresponding to the outer peripheral portion of the first wiring board 11. Therefore, the reliability of the connection between the external connection terminals 13 disposed on the external connection pads 31, 32 and the pads 15 of the mounting board 14 can be improved, and the reliability of the electrical connection between the semiconductor device 10 and the mounting board 14 can be improved.

Moreover, the configuration where the external connection pads 31, 32 are placed on the inner side of the test pads 34, 35 allows the wiring lengths of the first wiring patterns 37, 38 which electrically connect the internal connection pads 28, 29 with the test pads 34, 35, and those of the second wiring patterns 41, 42 which electrically connect the semiconductor element mounting pads 25, 26 with the external connection pads 31, 32, to be shortened, and also the routing of the first and second wiring patterns 37, 38, 41, 42 not to become complicated. Therefore, crosstalk (noises) due to the first and second wiring patterns 37, 38, 41, 42 can be reduced.

A core board (for example, a glass epoxy board in which glass fiber is impregnated with a resin) may be disposed between the stacked insulating layers 21, 22 disposed in the first wiring board 11. Also in the case where a core-equipped build-up board is used as the first wiring board 11, namely, the same effects as the wiring board 11 (coreless board) in the embodiment can be attained. A core-equipped build-up board may be used as the second wiring board 17.

Figure 3:
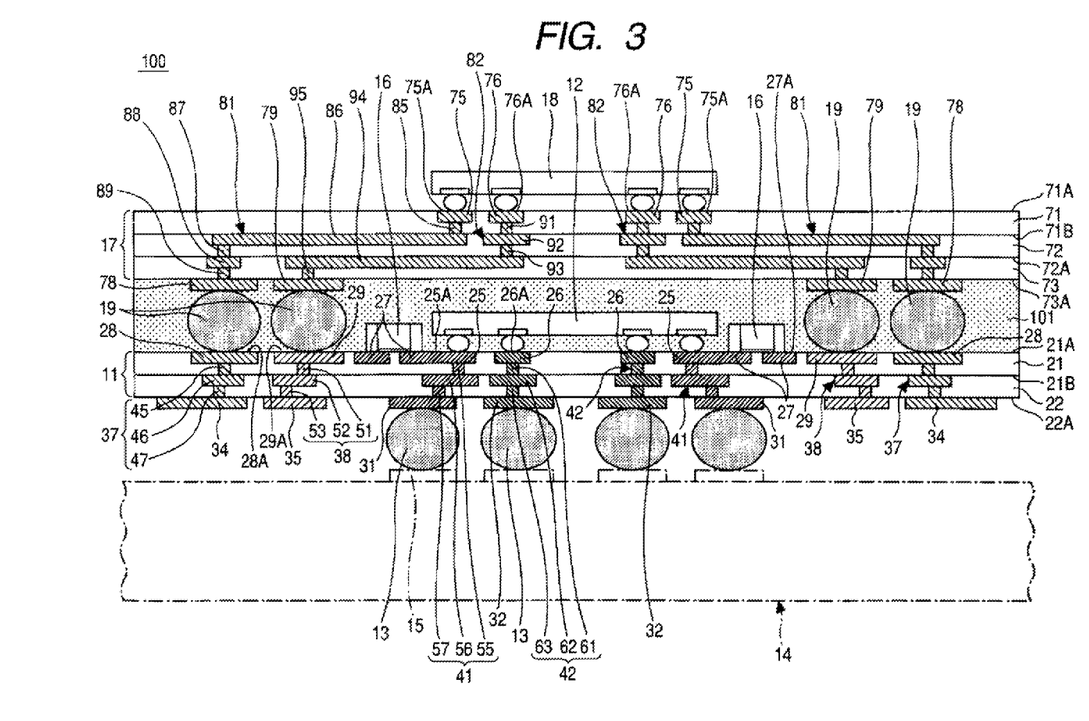
FIG. 3 is a sectional view of a semiconductor device which is a first modification of the embodiment of the invention.

FIG. 3 is a sectional view of a semiconductor device which is a first modification of the embodiment of the invention. In FIG. 3, components which are identical with those of the semiconductor device 10 of the embodiment are denoted by the same reference numerals.

Referring to FIG. 3, the semiconductor device 100 of the first modification of the embodiment is configured in the same manner as the semiconductor device 10 of the embodiment except that a sealing resin 101 for sealing the semiconductor element 12 and the internal connection terminals 19 is disposed in the gap between the first and second wiring boards 11, 17 disposed in the semiconductor device 10.

The sealing resin 101 is placed so as to fill the gap between the first wiring board 11 and the second wiring board 17. As the sealing resin 101, for example, a mold resin may be used. As the material of the mold resin, for example, an epoxy resin may be used.

In the configuration where the sealing resin 101 for sealing the semiconductor element 12 and the internal connection terminals 19 placed in the gap between the first and second wiring boards 11, 17 is disposed, the connection strength between the first and second wiring boards 11, 17 and the internal connection terminals 19 can be improved, and, when a shock is externally applied to the semiconductor device 100, the semiconductor element 12 can be prevented from being broken.

Figure 4:
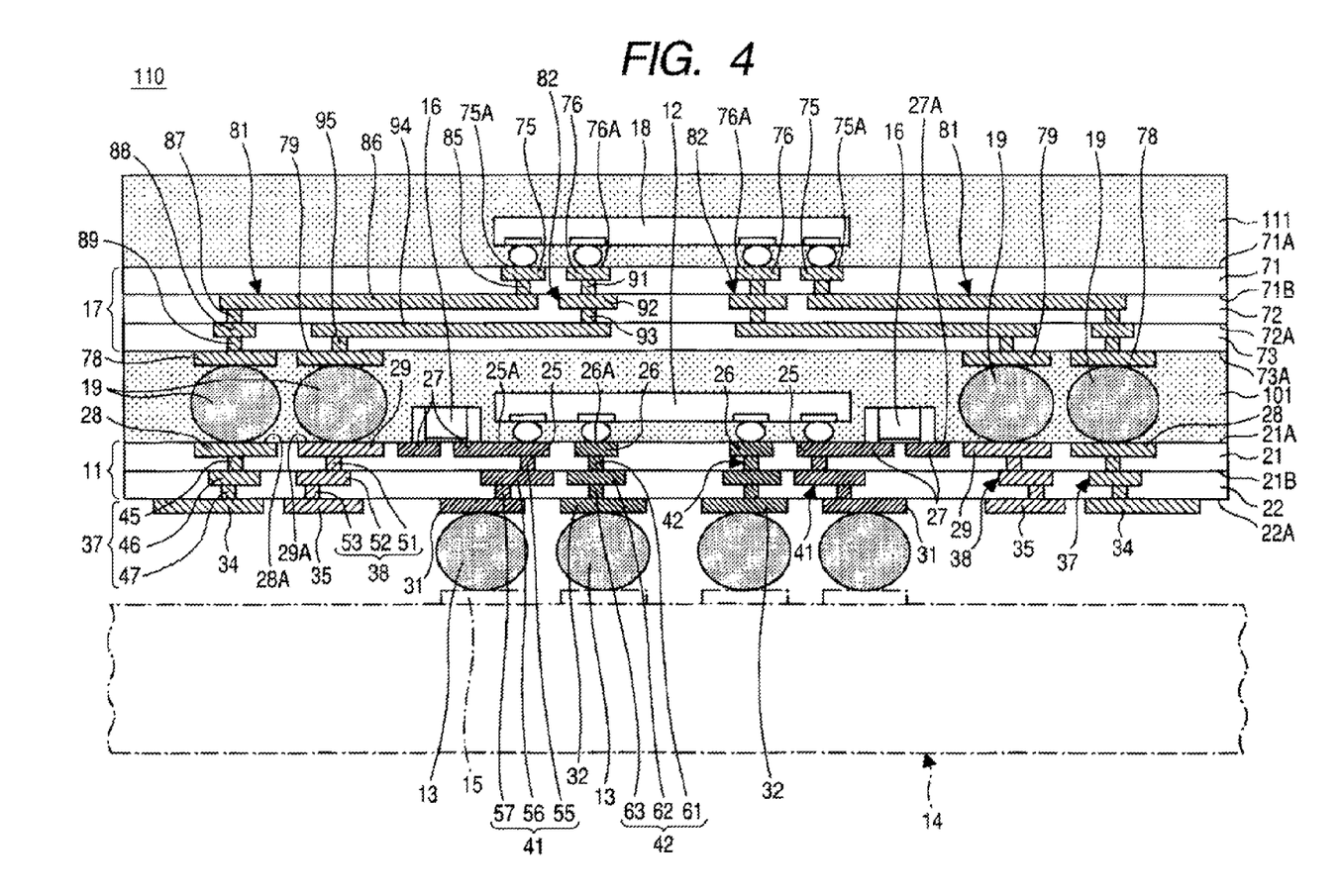
FIG. 4 is a sectional view of a semiconductor device which is a second modification of the embodiment of the invention.

FIG. 4 is a sectional view of a semiconductor device which is a second modification of the embodiment of the invention. In FIG. 4, components which are identical with those of the semiconductor device 100 of the first modification of the embodiment are denoted by the same reference numerals.

Referring to FIG. 4, the semiconductor device 110 of the second modification of the embodiment is configured in the same manner as the semiconductor device 100 of the first modification of the embodiment except that a sealing resin 111 for sealing the electronic component 18 is further disposed.

The sealing resin 111 is disposed on the upper face 71A of the insulating layer 71 so as to seal the electronic component 18. As the sealing resin 111, for example, a mold resin may be used. As the material of the mold resin, for example, an epoxy resin may be used.

In the configuration where the sealing resin 111 for sealing the electronic component 18 is disposed on the upper face 71A of the insulating layer 71, it is possible to prevent the electronic component 18 from being broken when a shock is externally applied to the semiconductor device 110.

Although the preferred embodiment of the invention has been described in detail, the invention is not restricted to the specific embodiment, and can be variously modified or changed within the scope of the spirit of the invention set forth in the appended claims.

In the semiconductor devicees 10, 100, 110, in the method of connecting the semiconductor element 12, and that of connecting the electronic component 18 in the case where a semiconductor element is used as the electronic component 18, for example, the flip chip connection may be used, or the wire bonding connection may be used.

The invention can be applied to a semiconductor device including a wiring board which is to be connected with a mounting board, and which is electrically connected with another wiring board.

What is claimed is:

1. A semiconductor device comprising:
    a first wiring board having plural stacked insulating layers,
    an internal connection pad which is disposed on a side of an upper face of the plural stacked insulating layers,
    a semiconductor element mounting pad which is disposed on the side of the upper face of the plural stacked insulating layers,
    a test pad which is disposed on a side of a lower face of the plural stacked insulating layers, said test pad being only used for electrical inspection of the semiconductor device, and
    an external connection pad which is disposed on the side of the lower face of the plural stacked insulating layers;
    an external connection terminal, said external connection terminal being provided only on the external connection pad;
    a first wiring pattern which is disposed in the plural stacked insulating layers, and which electrically connects the internal connection pad with the test pad, and
    a second wiring pattern which electrically connects the semiconductor element mounting pad with the external connection pad;
    a second wiring board which is placed above the first wiring board, which is mounted on the internal connection pad, and which is electrically connected with the first wiring board;
    a semiconductor element which is mounted on the semiconductor element mounting pad;
    a mounting board, wherein said external connection terminal electrically connects the external connection pad to the mounting board;
    wherein the test pad is spaced a distance from the mounting board so as to permit access to the test pad disposed on the lower face of the plural stacked insulating layers, and such that said test pad is not electrically connected to said mounting board; and,
    wherein the external connection pad is placed on an inner side of the test pad.

2. The semiconductor device according to claim 1, wherein the external connection pad is placed in a portion corresponding to a middle portion of the first wiring board.

3. The semiconductor device according to claim 1, wherein the test pad is placed to be opposed to the internal connection pad, and the semiconductor element mounting pad is placed to be opposed to the external connection pad.

4. The semiconductor device according to claim 1, further comprising:
    a sealing resin which is disposed between the first wiring board and the second wiring board and seals the semiconductor element and the internal connection pad.

5. The semiconductor device according to claim 1, further comprising an internal connection terminal disposed between the first and second wiring boards and electrically connected to the internal connection pad, wherein the internal connection terminal is an electrically conductive ball which includes a core portion which is used for maintaining a gap between the first wiring board and the second wiring board at a predetermined value, and a covering portion which covers the core portion.

6. The semiconductor device according to claim 1, wherein the first wiring board has a core board disposed between the plural stacked insulating layers.

7. The semiconductor device according to claim 1, wherein the first wiring board has an electronic component mounting pad which is disposed on the side of the upper face of the plural stacked insulating layers, and
    wherein the semiconductor device further comprises an electronic component which is mounted on the electronic component mounting pad.

8. The semiconductor device according to claim 7, further comprising:
    another electronic component disposed on a face of the second wiring board, the face being located on a side opposite to a side opposed to the first wiring board.

* * * * *